(12) United States Patent
Bisplinghoff et al.

(10) Patent No.: US 9,917,600 B2
(45) Date of Patent: *Mar. 13, 2018

(54) FORWARD ERROR CORRECTION WITH TURBO/NON-TURBO SWITCHING

(71) Applicant: Cisco Technology, Inc., San Jose, CA (US)

(72) Inventors: Andreas Bisplinghoff, Forchheim (DE); Stefan Langenbach, Lauf a.d. Pegnitz (DE); Norbert Beck, Schwabach (DE)

(73) Assignee: Cisco Technology, Inc., San Jose, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 15/397,873

(22) Filed: Jan. 4, 2017

(65) Prior Publication Data

US 2017/0117924 A1   Apr. 27, 2017

Related U.S. Application Data

(63) Continuation of application No. 14/704,385, filed on May 5, 2015.

(30) Foreign Application Priority Data

May 7, 2014 (GB) .................................. 1408022.0

(51) Int. Cl.
*H03M 13/00* (2006.01)
*H03M 13/29* (2006.01)
(Continued)

(52) U.S. Cl.
CPC .... *H03M 13/2957* (2013.01); *H03M 13/1111* (2013.01); *H03M 13/3746* (2013.01); *H03M 13/458* (2013.01); *H04L 1/0045* (2013.01)

(58) Field of Classification Search
CPC ... H04L 1/0057; H04L 1/0061; H04L 1/0041; H04L 1/0083; H04L 1/0072
(Continued)

(56) References Cited

U.S. PATENT DOCUMENTS 6,526,538 B1   2/2003 Hewitt
7,085,987 B2 *  8/2006 Hewitt ................ H03M 13/258
                                                714/755
(Continued)

FOREIGN PATENT DOCUMENTS

CN   103220046 A   7/2013
EP   2709303 A2   3/2014

OTHER PUBLICATIONS

Bisplinghoff et al., "Soft Decision Metrics for Differentially Encoded QPSK", IEEE, Optical Communication (ECOC), 2011 37th European Conference and Exhibition on, Sep. 2011, 3 pages.
(Continued)

*Primary Examiner* — Albert Decady
*Assistant Examiner* — Enam Ahmed
(74) *Attorney, Agent, or Firm* — Edell, Shapiro & finnan, LLC

(57) ABSTRACT

A forward error correction and differentially encoded signal obtained via a communication channel is supplied to a soft-input soft-output (SISO) differential decoder that is bi-directionally coupled to a SISO forward error correction decoder. Over a first portion of a plurality of decoding iterations of the differentially encoded signal, the SISO differential decoder and the SISO forward error correction decoder are operated in a turbo decoding mode in which decoded messages generated by the SISO differential decoder are supplied to the SISO forward error correction decoder and forward error correction messages are supplied to the differential decoder. Over a second portion of the
(Continued)

plurality of decoding iterations of the differentially encoded signal, the SISO forward error correction decoder is operated in a non-turbo decoding mode without any messages passing to and from the SISO differential decoder. Decoder output is obtained from the SISO forward error correction decoder.

20 Claims, 9 Drawing Sheets

(51) Int. Cl.
*H04L 1/00* (2006.01)
*H03M 13/45* (2006.01)
*H03M 13/37* (2006.01)
*H03M 13/11* (2006.01)

(58) Field of Classification Search
USPC .......................................................... 714/776
See application file for complete search history.

(56) References Cited

U.S. PATENT DOCUMENTS

| | | | |
|---|---|---|---|
| 7,603,612 B2* | 10/2009 | Nieto | H03M 13/2957 714/755 |
| 8,413,012 B2 | 4/2013 | Limberg | |
| 2004/0240590 A1 | 12/2004 | Cameron et al. | |
| 2005/0031025 A1* | 2/2005 | Xie | H04L 1/0046 375/222 |
| 2005/0138520 A1 | 6/2005 | Richardson | |
| 2005/0262408 A1 | 11/2005 | Tran et al. | |
| 2006/0156163 A1* | 7/2006 | Berens | H04L 1/005 714/748 |
| 2013/0346824 A1 | 12/2013 | Bolotov et al. | |
| 2015/0326253 A1 | 11/2015 | Bisplinghoff et al. | |
| 2016/0072523 A1* | 3/2016 | Muhammad | H04L 1/0041 714/776 |
| 2016/0127037 A1* | 5/2016 | Cavaliere | H04L 1/005 398/25 |

OTHER PUBLICATIONS

Bisplinghoff et al., "Turbo Differential Decoding Failure for a Coherent Phase Slip Channel", IEEE, Optical Communications (ECOC), 2012 38th European Conference and Exhibition on, Sep. 2012, 3 pages.
Franceschini et al., "Serial Concatenation of LDPC Codes and Differential Modulations", IEEE, Journal on Selected Areas in Communications, vol. 23, No. 9, Sep. 2005, 11 pages.
Franceschini et al., "Detection by Multiple Trellises", IEEE, Transactions on Communications, vol. 57, No. 3, Mar. 2009, pp. 726-737.
Franceschini et al., "A Novel Class of Low-Complexity SISO Algorithms for Phase-Uncertain Communications", Information Theory, 2005. ISIT 2005. Proceedings. International Symposium on, Sep. 2005, 5 pages.
Combination Search and Examination Report in counterpart Great Britain Application No. GB1408022.0, dated Oct. 24, 2014, 6 pages.
Miyata et al., "Efficient FEC for Optical Communications using Concatenated Codes to Combat Error-floor", Optical Fiber communication/National Fiber Optic Engineers Conference, 2008. OFC/NFOEC 2008, Feb. 2008, 3 pages.
Yu et al., "Soft-Decision LDPC Turbo Decoding for DQPSK Modulation in Coherent Optical Receivers", Optical Communication (ECOC), 2011 37th European Conference and Exhibition on, Sep. 2011, 3 pages.
Examination Report in counterpart Great Britain Application No. GB1408022.0, dated Mar. 5, 2015, 2 pages.
A. Bisplinghoff et al., "Cycle Slip Tolerant Hybrid Turbo Differential Decoding", ECOC, Cannes, France, Th.2.3.3, Sep. 21-25, 2014, 3 pages.
Extended European Search Report in counterpart European Application No. 15166834.0, dated Aug. 19, 2015, 15 pages.

* cited by examiner

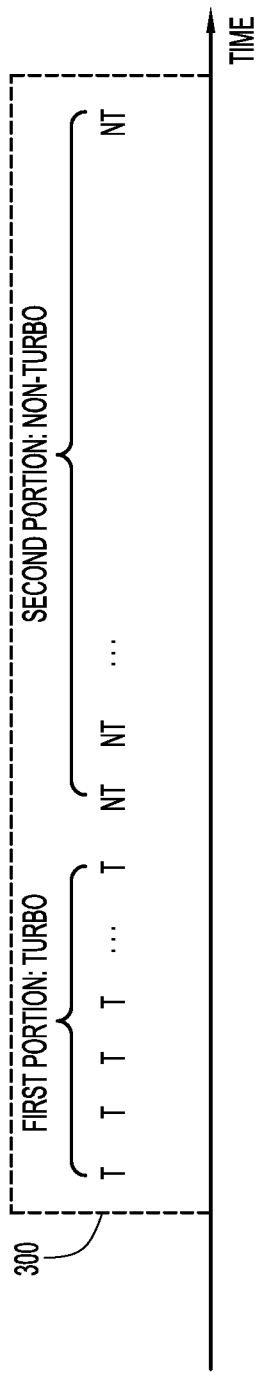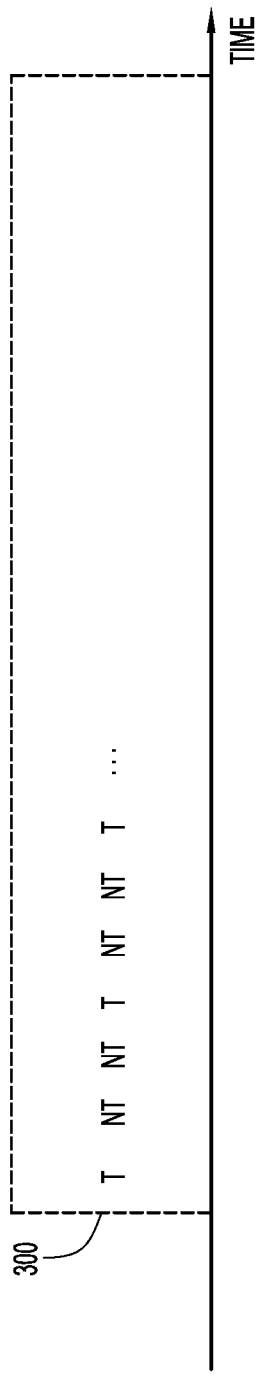

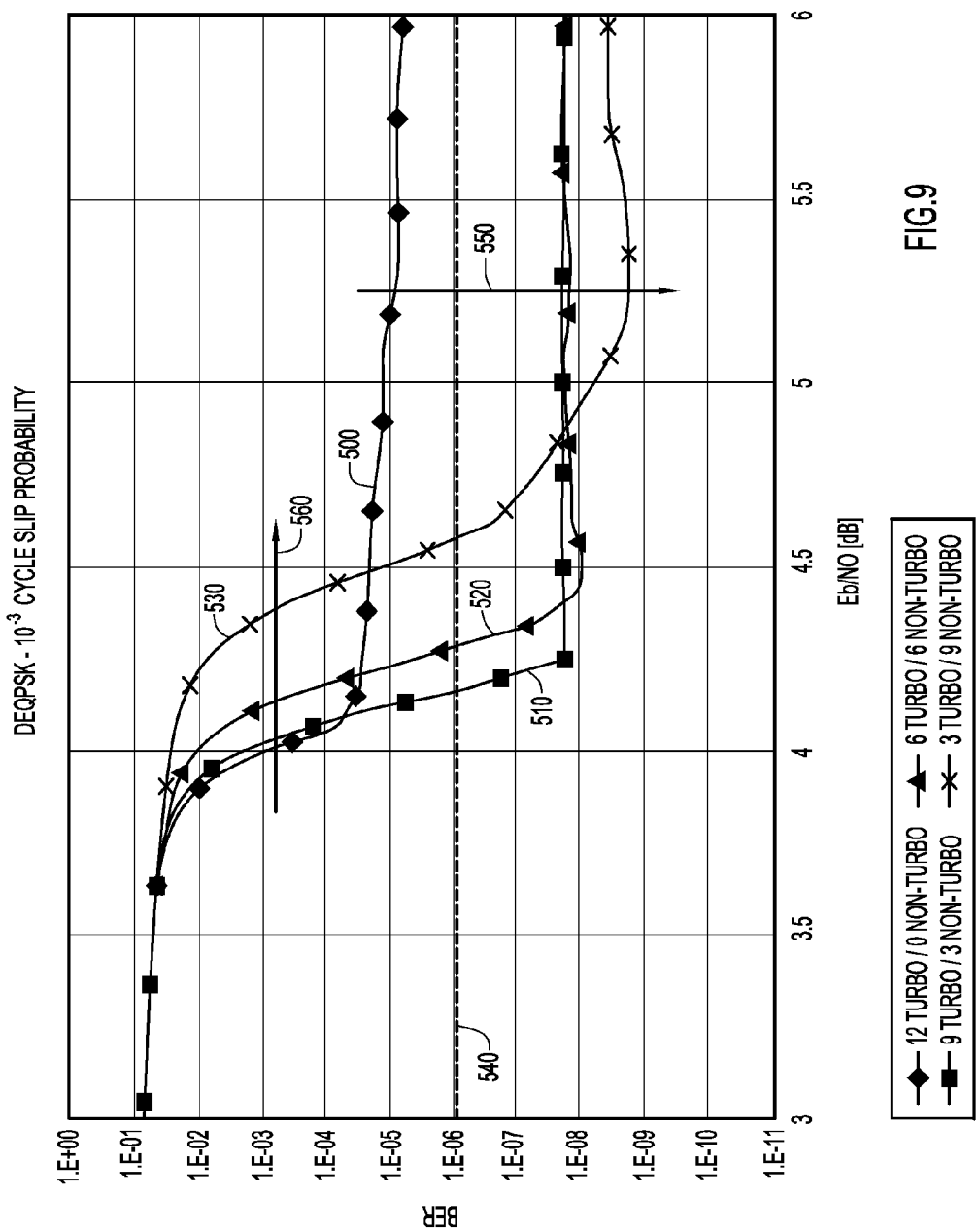

US 9,917,600 B2

FORWARD ERROR CORRECTION WITH TURBO/NON-TURBO SWITCHING

PRIORITY CLAIM

This application is a continuation of U.S. application Ser. No. 14/704,385, filed May 5, 2015, which in turn claims priority to British Patent Application No. GB 1408022.0, filed May 7, 2014, the entirety of which is incorporated herein by reference.

TECHNICAL FIELD

The present disclosure relates to forward error correction decoding of signals received via a communication channel.

BACKGROUND

In communication systems and networks, error correction coding is often employed in order to increase the ability to recover the originally transmitted data in the presence of channel noise and related impairments. Forward error correction coding is one type of coding scheme that is commonly employed.

There are a variety of forward error correction coding techniques, each having certain advantages. Conditions may occur in the communication channel that present challenges in using forward error correction coding/decoding.

BRIEF DESCRIPTION OF THE DRAWINGS

FIGS. 7A and 7B are timing diagrams illustrating examples of switching between the turbo decoding mode and the non-turbo decoding mode, according to an example embodiment.

FIG. 9 illustrates graphical plots of bit error rate versus signal-to-noise ratio for different switching schedules, and illustrating the benefits of switching between the turbo decoding mode and the non-turbo decoding mode, according to an example embodiment.

DESCRIPTION OF EXAMPLE EMBODIMENTS

Overview

Figure 1:
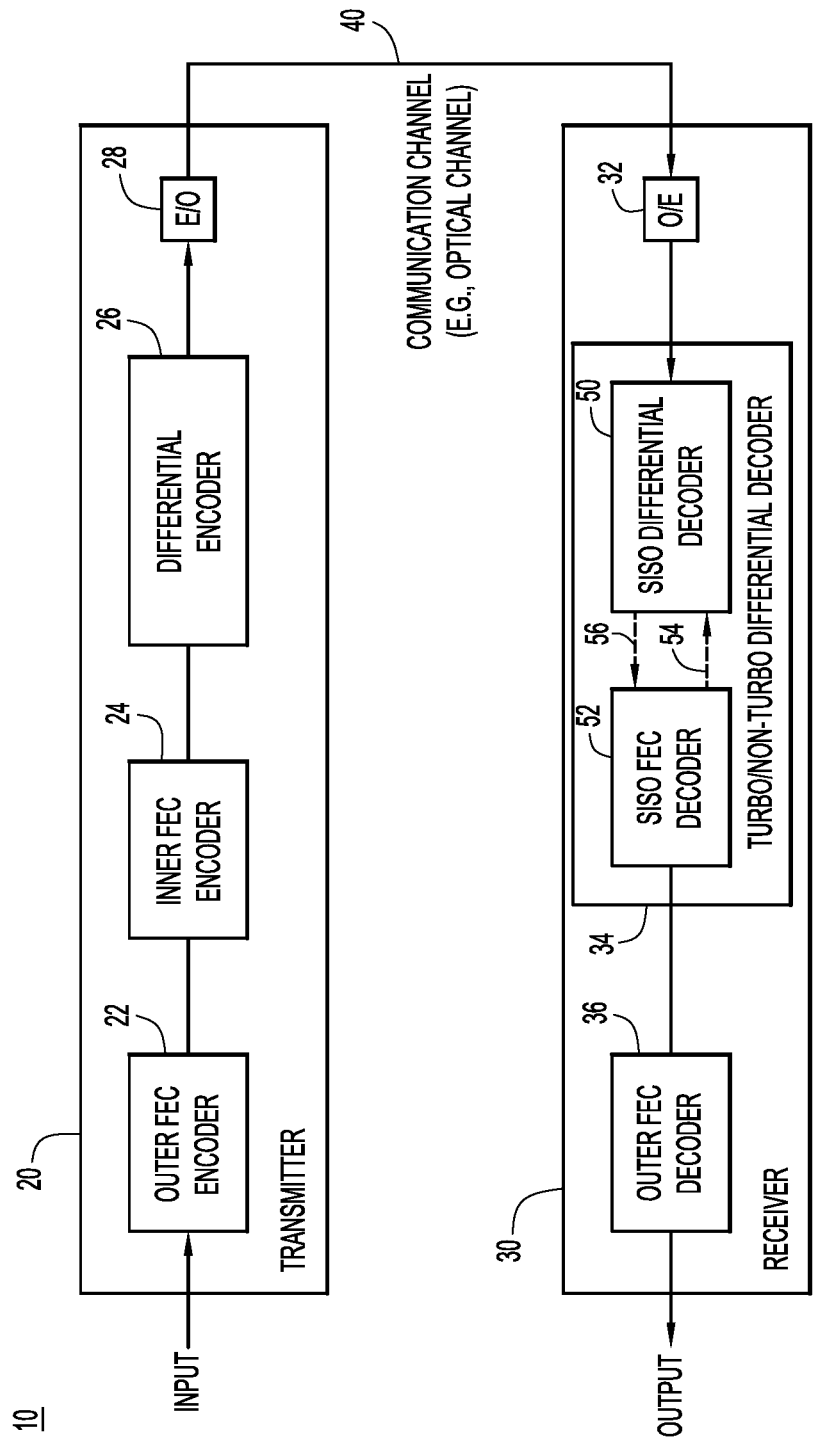
FIG. 1 is a block diagram of a communication system in which a turbo/non-turbo differential decoder in a receiver is configured to switch between a turbo decoding mode and a non-turbo decoding mode, according to an example embodiment.

In accordance with an example embodiment, a forward error corrected and differentially encoded signal obtained via a communication channel is supplied to a soft-in-soft-out (SISO) differential decoder that is coupled to a SISO forward error correction decoder. Over a first and initial portion of a plurality of decoding iterations for a given frame of the differentially encoded signal, the SISO differential decoder and the SISO forward error correction decoder are operated in a turbo decoding mode in which soft-decision messages (carrying a-posteriori reliability semantics) generated by the SISO differential decoder are supplied to the SISO forward error correction decoder and forward error correction messages (carrying extrinsic reliability semantics) are supplied to the SISO differential decoder. Over a second and final portion of the plurality of decoding iterations of the differentially encoded signal, the SISO forward error correction decoder is operated in a non-turbo decoding mode without any messages passing to and from the SISO differential decoder. Decoder output is obtained from the SISO forward error correction decoder. The first and initial portion of decoding iterations comprises a first predetermined number of decoding iterations for the given frame and the second and final portion of decoding iterations comprises a second predetermined number of decoding iterations for the given frame, and wherein operating in the non-turbo decoding mode for the second predetermined number of decoding iterations is performed after operating in the turbo decoding mode for the first predetermined number of decoding iterations.

Example Embodiments

In many coherent optical communication systems, blind carrier phase estimation is used. The carrier phase estimation is said to be "blind" because it is performed without the use of training with pilot sequences. A local oscillator laser and conditions of the optical link can cause large phase noise leading to errors in the processing of the received signal. Carrier phase estimation tracks and corrects those phase errors, but it can happen that the receive signal constellation "slips" or rotates by +/−90 degrees and locks into an erroneous neighboring state in which receive signal processing based on absolute phase knowledge is constantly wrong. Differential encoding encodes the data into transitions between absolute phase symbols and can be used both to resolve initial phase ambiguities and to convert the effect of a cycle slip into a single local error event. However, differential encoding leads to signal-to-noise (SNR) penalties caused by the fact that a single symbol error affects two symbol transitions.

A type of decoding called "turbo" differential decoding can be used to compensate for the SNR penalty. If there are frequent cycle slips, however, even turbo differential decoding can fail. If the cycle slips increase, the post-forward error correction coding performance exhibits a severe error floor. The error floor rises for higher cycle slip probabilities. If the cyclic slip probability (CSP) is relatively high, techniques are needed to improve turbo differential decoding to avoid decoding failure. An outer forward error correction code (such as a Reed-Solomon code), often referred to as a "clean-up" code, can correct some errors, but if the cyclic slip probability is too high, the clean-up code cannot correct errors. For example, a 2 dB SNR improvement can be obtained using turbo differential decoding, but with rising cyclic slip probabilities, the error floor increases.

Reference is now made to FIG. 1. FIG. 1 shows a communication system 10 including a transmitter 20 and a receiver 30. The transmitter 20 transmits signals over communication channel 40 to the receiver 30. In one example, the communication channel 40 is an optical channel, e.g., an optical fiber. The transmitter 20 includes an "outer" forward error correction (FEC) encoder 22 that receives as input data to be transmitted, an "inner" FEC encoder 24, a differential encoder 26 and an electrical-to-optical converter (E/O) 28 in the case in which the communication channel 40 is an optical channel.

The receiver 30 includes an optical-to-electrical (O/E) converter 32, a turbo/non-turbo differential decoder 34 and an outer (hard-decision) FEC decoder 36. The turbo/non-turbo differential decoder 34 includes a soft-input soft-output (SISO) differential decoder 50 and an (inner) SISO FEC decoder 52. The output of the outer FEC decoder 36 is the decoded and originally transmitted data that was sent by the transmitter 20.

In one example, the outer hard-decision FEC encoder 22 may be a high rate Reed-Solomon encoder, BCH encoder or an ITU G.975 encoder and the inner FEC encoder 24 may be a Low Density Parity Check (LDPC) encoder. On the receive side, the SISO FEC decoder 52 may be a LDPC decoder and the outer FEC decoder 36 may be Reed-Solomon decoder. The outer FEC decoder 36 can be used to correct for residual bit errors in the error floor region of the inner FEC, which were not corrected by the turbo/non-turbo differential decoder 34.

Differential encoding is useful to resolve four-fold phase ambiguity of, for example, Quadrature Phase Shift Keying (QPSK) and to deal with cycle slips, caused by blind carrier phase recovery. In a coherent communication system, such as a coherent optical communication system, differential decoding can transform single symbol errors into two consecutive symbol errors. In the case of soft-decoded forward error correction codes with 20% overhead and 11 dB net coding gain, this error doubling translates into an SNR penalty of about 1.2 dB.

It has been found that up to $10^{-3}$ cycle slip probability is expected in the case of a highly nonlinear transmission with on-off-keying (OOK) neighbors because of strong cross phase modulation. A high error floor ($>10^{-6}$) might exceed correction capabilities of the outer hard decision decoder 36 with typically low overhead (<2%). In the case of frequent turbo differential decoding failures, a post-forward error correction bit error rate below $10^{-15}$ cannot be guaranteed. Thus, turbo differential decoding is able to improve the system performance for an Additive White Gaussian Noise (AWGN) channel, but fails in the presence of frequent cycle slips of the received signal.

The SNR penalty due to differential encoding can partially be removed by turbo differential decoding. Turbo differential decoding involves feedback from the forward error correction decoder 52 to the SISO differential decoder 50, as shown at reference numeral 54 in FIG. 1. However, cycle slips can cause failures in turbo differential decoding. As described further below in connection with FIGS. 2 and 3, the turbo/non-turbo differential decoder 34 switches from a turbo decoding mode after a certain number of decoding iterations to a non-turbo decoding mode. The switch may be based on a fixed/static configuration or it may be dynamically adaptive. Thus, the feedback depicted at reference numeral 54 associated with turbo decoding is shown as a dotted arrow, indicating that it is not always occurring (when a switch is made to the non-turbo decoding mode), according to the example embodiments presented herein. Similarly, the output from the SISO differential decoder 50 to the SISO FEC decoder 52, shown at reference numeral 56, is disabled when operating in the non-turbo decoding mode.

Figure 2:
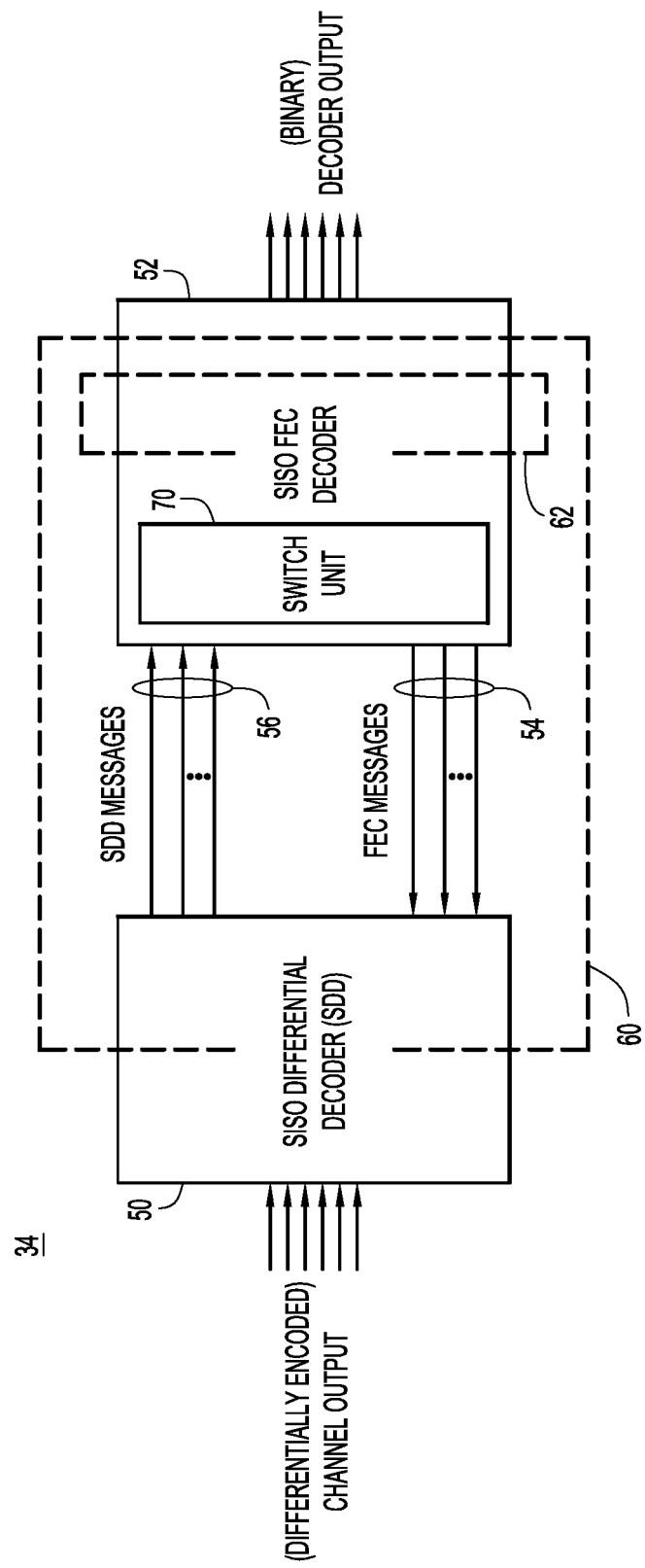
FIG. 2 is a high level block diagram of the turbo/non-turbo differential decoder, according to an example embodiment.

FIG. 2 shows the turbo/non-turbo differential decoder 34 in isolation. The SISO differential decoder (SDD) 50 receives as input a differentially encoded signal received from a communication channel, i.e., channel output. The SDD 50 may operate according to any of a variety of SISO differential decoding algorithms now known or hereinafter developed. One such algorithm is the Bahl, Cocke, Jelinek and Raviv (BJCR) algorithm. The BJCR algorithm performs maximum a posteriori decoding of error correcting codes defined on trellises, such as convolutional codes, and is therefore also applicable for SISO differential decoding.

The SDD 50 generates as output SDD messages 56 (also called soft-decision messages herein) that are supplied as input to the SISO FEC decoder 52. As explained above, the SISO FEC decoder 52 may be any SISO decoder, for example, configured to perform LDPC decoding, or other coding schemes, such as Turbo Product Coding (TPC), Luby-Transform Coding, etc. The SISO FEC decoder 52 includes inputs to receive SDD messages generated as output by the SDD 50. The SISO FEC decoder 52 performs soft-decision FEC decoding on the SDD messages to generate (binary) decoder output. In addition, when operating in a turbo decoding mode, feedback 54, comprising FEC messages, is supplied to the SDD 50 and SDD messages 56 are supplied as input to the FEC decoder 52.

As shown in FIG. 2, turbo/non-turbo differential decoder 34 is configured to switch between a turbo decoding mode in which FEC messages are fed back to the SDD 50 and SDD messages are supplied the SISO FEC decoder 52 from the SDD 50, and a non-turbo decoding mode in which the SISO FEC decoder 52 operates without any messages passing to and from the SDD 50. The turbo decoding mode is shown by the loop indicated at reference numeral 60 and the non-turbo decoding mode is shown by the loop indicated at reference numeral 62. In general, and as described further hereinafter, the SDD 50 and SISO FEC decoder 52 are configured to operate in a turbo decoding mode for a first number of decoding iterations and in a non-turbo decoding mode for a second number of decoding iterations. In the non-turbo decoding mode, the SISO FEC decoder 52 operates without feeding back the FEC messages to the SDD 50 and without receiving SDD messages 54 from the SDD 50. A switch unit 70 is provided to handle the re-direction of messages between the FEC decoder 52 and the SDD 50 in switching between the turbo decoding mode and non-turbo decoding mode. As will become more apparent hereinafter, the messages that are passed to the SDD 50 (in turbo mode) and the messages that are exchanged internally in the SISO FEC decoder 52 (in non-turbo mode) are not only re-directed, but require also individual computation, according to their respective function in the message passing algorithm. In other words, the SDD 50 will in general expect another message type as the internal counterpart for non-turbo decoding.

Figure 3:
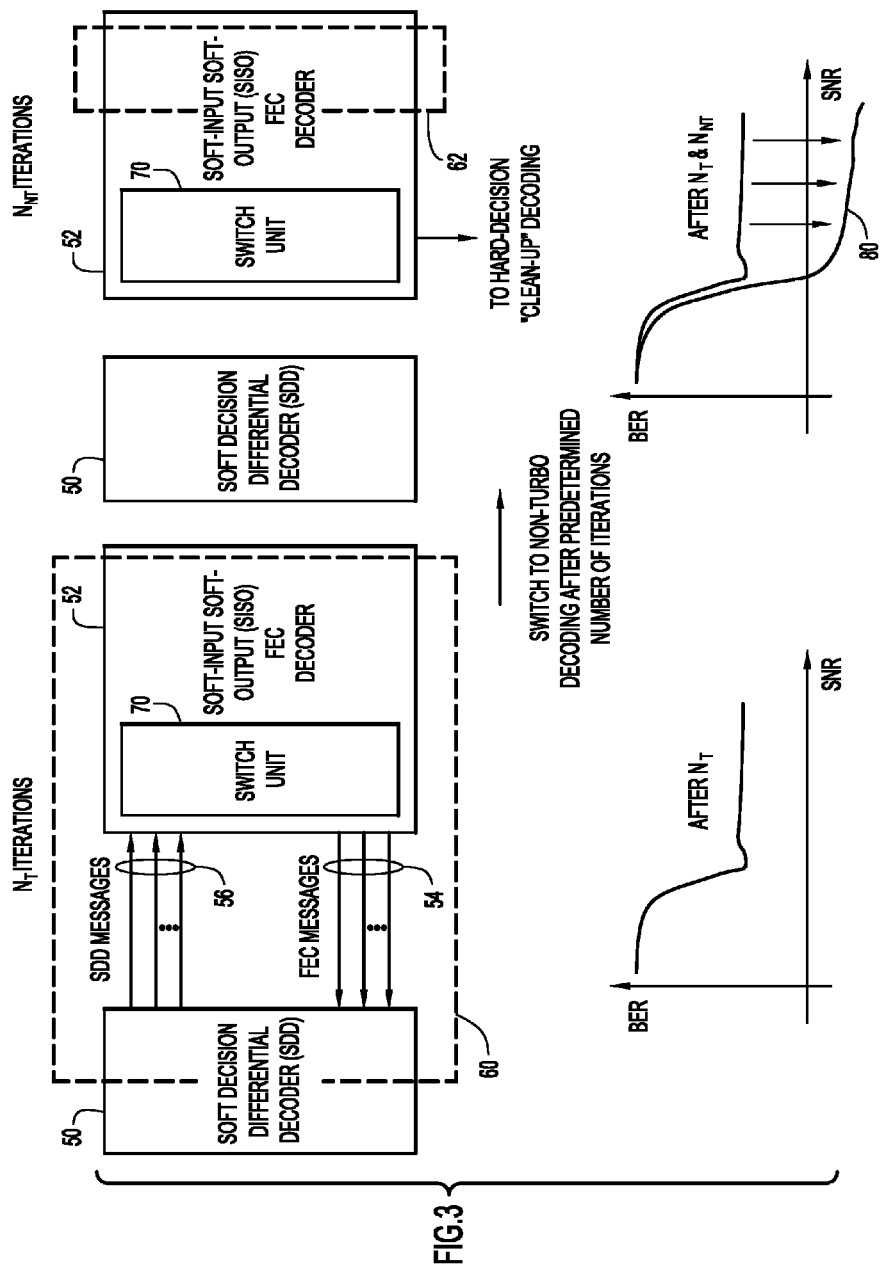
FIG. 3 is a diagram illustrating the turbo decoding mode operation and the non-turbo decoding mode operation of the turbo/non-turbo differential decoder and impact on error floor, according to an example embodiment.

Reference is now made to FIG. 3. FIG. 3 shows example plots of bit error rate (BER) versus SNR for both the turbo decoding mode as shown on the left and the non-turbo decoding mode, as shown on the right. In the presence of cycle slips, there are residual bit errors after a predetermined number of turbo iterations (denoted $N_T$). These errors cannot be corrected even with additional turbo decoding iterations. The error floor becomes somewhat elevated as the CSP increases, as shown in the figure. The reason for this error floor is that the SDD 50 and the FEC decoder 52 cannot converge to a common solution: There is no convergence to a solution in which all check equations are fulfilled and all associated phase transitions lead to a consistent path in the trellis. That is, the cyclic slip is not consistent with a contiguous path through the trellis of the differential code. In the turbo decoding mode, the turbo/non-turbo differential decoder 34 stabilizes to an erroneous state.

The BER versus SNR plot on the right of FIG. 3 shows the improvement in error floor that can be achieved when a switch is made to a non-turbo decoding mode after a predetermined number of iterations ($N_T$) in the turbo decoding mode. When the switch to the non-turbo decoding mode is made, the FEC decoder 52 iterates without any feedback to and from the SDD 50. The output of the SDD 50 becomes corrupted in the presence of increased cycle slips and should be omitted, and this is achieved by switching to a non-turbo mode for a predetermined number of decoding iterations, denoted as $N_{NT}$. Several non-turbo iterations can reduce the error floor as shown at reference numeral 80 in FIG. 3. Further hard-decision FEC decoding can correct any residual errors that may occur during the non-turbo mode decoding.

Figure 4:
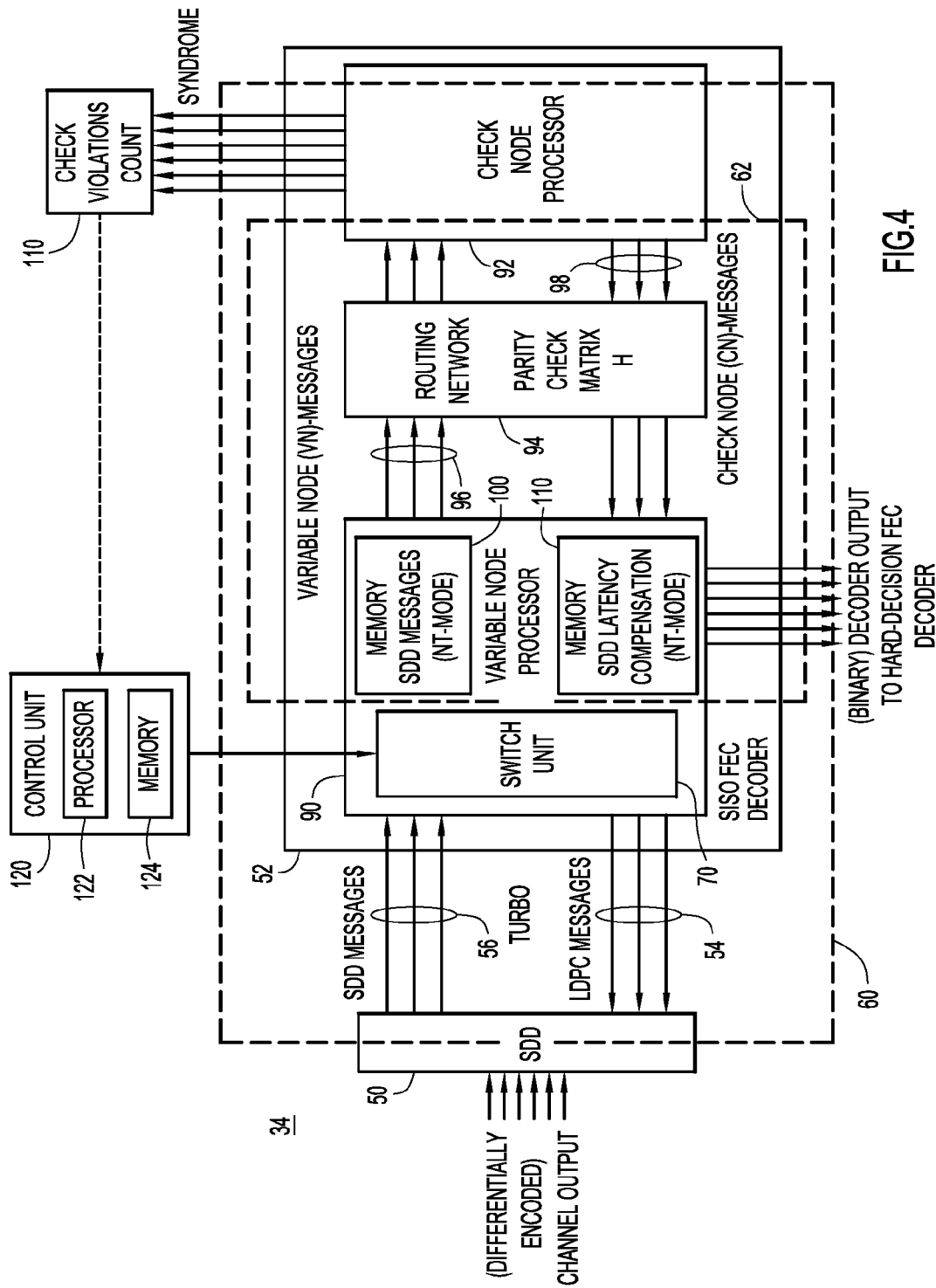
FIG. 4 is a more detailed block diagram of the turbo/non-turbo differential decoder, according to an example embodiment.

Turning now to FIG. 4, an example block diagram is shown of an embodiment in which the SISO FEC decoder 52 is an LDPC decoder. In this embodiment, the SISO FEC decoder 52 includes a variable node processor 90, a check node processor 92, and a routing network 94 that implements a parity check matrix H between a plurality of variable bit nodes of the variable node processor 90 and a plurality of check nodes of the check node processor 92. The variable node processor 90 generates variable node (VN) messages shown at reference numeral 96 that are passed to the routing network 94. The check node processor 92 generates check node (CN) messages 98 that are passed to the routing network 94.

In addition, a first memory (e.g., random access memory) 100 and a second memory 110 are provided as part of the variable node processor 90. The first memory 100 is provided to store/buffer SDD messages received from the SDD 50 for use when switch over is made to the non-turbo decoding mode, and the second memory 110 is provided to store check node messages to account for any latency associated with the SDD 50 in turbo decoding and non-turbo decoding modes. Furthermore, in the example in which the SISO FEC decoder is configured to perform LDPC-based decoding, the FEC messages 54 fed back to the SDD 50 are LDPC messages. Thus, the variable node processor 90 calculates LDPC messages and variable node messages in the turbo decoding mode or computes variable node messages only in the non-turbo decoding mode.

FIG. 4 also shows a control unit 120. The control unit 120 supplies controls to the switch unit 70 to enable the flow of messages between the SISO FEC decoder 52 and the SDD 50 for the turbo decoding mode, and isolates the SISO FEC decoder 52 and the SDD 50. Moreover, the control unit 120 directs messages stored in memories 100 and 110 to the appropriate destinations for the non-turbo decoding mode. In one embodiment, the control unit 120 establishes a fixed/static schedule for switch-over from the turbo decoding mode to the non-turbo decoding mode. In other words, the control unit 120 may enable a first predetermined number of decoding iterations in the turbo decoding mode, and then switch to enable a second predetermined number of decoding iterations in the non-turbo decoding mode. The schedule may be one in which a switch is made repeatedly between turbo mode and non-turbo mode for a predetermined number of iterations. A fixed/static schedule is useful when the channel conditions are known and stable. Examples of various fixed schedules are described hereinafter in connection with FIGS. 7A and 7B.

In another embodiment, operation of the SISO decoder 52 is monitored and the control unit 120 receives as input a count of the number of check violations of the check node processor 92, as shown at 110. The number of check violations may be derived from syndrome messages output by the check node processor 92. In this embodiment, the control unit 120 dynamically determines when a switch should be made from the turbo decoding mode to the non-turbo decoding mode based on the number of check violations, as described further hereinafter. The schedule decision can also be derived from any internal (FEC decoder) or external (channel state estimation) observable condition, which is indicative of the actual cycle slip probability.

As shown in FIG. 4, the control unit 120 includes a processor 122 and a memory 124. The processor 122 may comprise a microcontroller or microprocessor, in one example embodiment. The memory 124 may comprise read only memory (ROM), random access memory (RAM), magnetic disk storage media devices, optical storage media devices, flash memory devices, electrical, optical, or other physical/tangible memory storage devices. Thus, in general, the memory 124 may comprise one or more tangible (non-transitory) computer readable storage media (e.g., a memory device) encoded with software comprising computer executable instructions and when the software is executed (by the processor 122) it is operable to perform the control unit operations described herein. Moreover, it is possible that one or more (or all) of the operations of the SDD 50 and SISO FEC decoder 52 may be implemented by software (instructions) stored/encoded in memory 124 and executed by a processor, e.g., processor 122.

Figure 5:
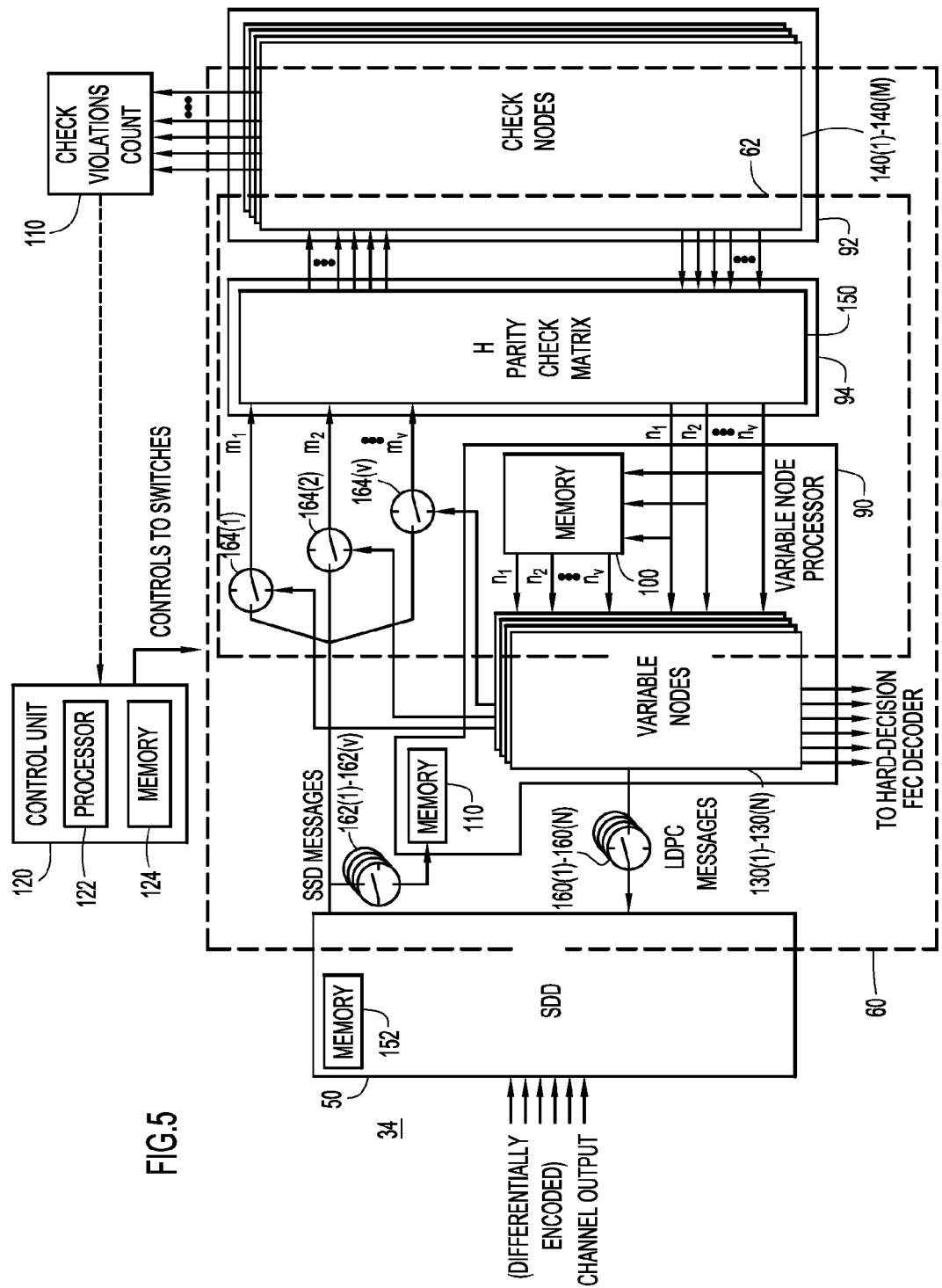
FIG. 5 is a still more detailed block diagram of the turbo/non-turbo differential decoder, according to an example embodiment.

Reference is now made to FIG. 5, which shows in more detail the arrangement generally depicted in FIG. 4. FIG. 5 shows that the variable node processor 90 includes a plurality of variable bit nodes 130(1)-130(N) as well as the memory 100 and memory 110. The check node processor 92 includes a plurality of check nodes 140(1)-140(M) and the routing network 94 implements the connections between check nodes (row) and variable nodes (columns) defined by the LDPC code's parity check matrix H shown at reference numeral 150. The routing network 94 can function in various ways and it need not physically and literally represent the parity check matrix H. The FEC messages that are fed back to the SDD 50 are LDPC messages in this example. There is also a memory 152 in the SDD that is used to store incoming differential encoded channel output, as explained hereinafter. For simplicity, it is to be understood that everything to the right of the SDD 50 (excluding the check violations count 110 and control unit 120) are part of the LDPC decoder.

In addition, FIG. 5 shows switches 160(1)-160(v), 162(1)-162(v), and switches 164(1)-164(v). The control unit 120 supplies a control signal to control each of these switches. Switches 160(1)-160(N) selectively couple the LDPC messages to the SDD 50. Switches 162(1)-162(v) are controlled to store the incoming SDD messages in memory 110 during a turbo decoding iteration or to discard the input in a non-turbo decoding iteration. Switches 164(1)-164(v) are controlled to either select the SDD messages from the SDD 50 or the variable node messages output from the variable nodes 130(1)-130(N). More specifically, switches 164(1)-164(v) are controlled to select the SDD messages from the SDD 50 during the first decoding iteration, and are controlled to select the variable node messages from variable nodes 130(1)-130(N) during the following decoding iteration.

The following LDPC parameters are defined and summarized for use in describing the operation of the LDPC decoder shown in FIG. 5.

Parity check matrix $H(M \times N)$.

N: code length, number of coded bits, number of variable nodes.

M: number of parity bits, number of check nodes.

$d_v$: variable node degree, number of ones in a column of H.

$d_c$: check node degree, number of ones in a row of H.

$d_v$ and $d_c$ can either be constant values (regular LDPC) or be degree distributions with individual values for all variable and check nodes (irregular LDPC).

$m_1$-$m_v$: variable node messages ($v=d_v N=d_c M$).

$n_1$-$n_v$: check node messages ($v=d_v N=d_c M$).

$n_1$-$n_v$ and $m_1$-$m_v$ carry reliability information which is typically represented by logarithmic likelihood ratios (LLR).

a-posteriori: enhanced reliability information conditioned on some given information (such as channel observations or code constraints).

a-priori: unconditional reliability information.

For LDPC decoder initialization, all messages ($m_1$-$m_v$, $n_1$-$n_v$, LDPC-messages, SDD-messages) and the corresponding memory entries are set to zero. Iterative decoding operation is as follows.

1. At the first iteration, the SDD 50 calculates a-posteriori LLRs exclusively on the basis of the differentially encoded channel output from a digital signal processor, for example, that generates the electrical signal obtained from the received optical signal. The differentially encoded channel output is also stored in the memory 152 of the SDD 50 for use in subsequent turbo iterations. At the first iteration, there is no a-priori input (LDPC-messages are initially set to zero) to be considered. The resulting SDD messages are forwarded to the LDPC decoder.

2. Also at the first iteration, each variable node 130(1)-130(N) receives one SDD-message and forwards $d_v$-fold duplicated values as variable node messages $m_1$-$m_{d_v}$ to the corresponding check nodes via the parity check matrix H. More specifically, each variable node produces $d_v$ messages and collectively all the variable nodes produce v messages. Each variable node stores the incoming SDD-message at a corresponding location in memory 110. Those stored messages are only required if the following iteration is a non-turbo iteration.

3. Each check node 140(1)-140(M) in the check node processor 92 receives $d_c$ variable node messages and evaluates the parity check equation depending on the message passing algorithm employed (e.g., min-sum, sum-product etc.). Each check node produces $d_c$ messages and collectively all the check nodes produce v messages. The resulting check node messages $n_1$-$n_{d_c}$ generated by the check nodes are returned to the variable nodes 130(1)-130(N) in the variable node processor 90 via the parity check matrix H.

4. In a turbo iteration each variable node calculates one LDPC message according to $L_{LDPC}=\Sigma n_i$, $i=1 \ldots d_v$. Those messages are forwarded to the SDD 50 via switches 160(1)-160(N) as a-priori input. Each variable node stores the incoming check node messages $n_1$-$n_{d_v}$ received from the check nodes in memory 100, in turbo mode as well as in non-turbo mode operation. The memory 100 stores values to compensate for the latency of the SDD 50 to wait for the updated SDD messages in a turbo iteration. In a non-turbo iteration, the latency of the SDD 50 is compensated for to avoid collisions with other frames in a pipelined decoder architecture since in non-turbo decoding, there is no need to wait for SDD messages.

5. In a turbo iteration, the SDD 50 calculates updated SDD messages on the basis of the differential encoded channel output (stored in memory 152) and on the basis of the a-priori knowledge provided by the LDPC messages from the LDPC decoder. The updated SDD messages are passed to the variable node processor 90 via switches 162(1)-162(v).

6. Each variable node 130(1)-130(N) calculates $d_v$ variable node messages $m_1$-$m_{d_v}$ according to $m_i=L_{SDD}+\Sigma n_j$ with $j=1 \ldots d_v, \neq i$, where $L_{SDD}$ denotes the SDD messages generated by the SDD 50. The $n_i$ are obtained from the memory 100 that were stored there in step 4 above. In a non-turbo iteration, the variable nodes use the "old" SDD messages that were stored in memory 110. In a turbo iteration, the variable nodes use the updated a-posteriori input messages $L_{SDD}$ coming from the SDD 50. Each variable node overwrites the old SDD messages that are stored in a memory 110 with the new incoming SDD messages. Those messages are only required if the subsequent iteration is a non-turbo iteration. The variable node messages $m_1$-$m_{d_v}$ are then passed to the check node processor 92.

7. Steps 3 to 6 are repeated until a maximum number of iterations is reached, or a syndrome evaluation of the check node processor 92 detects a valid FEC frame.

There is variant that is possible to reduce complexity in the operation of the turbo differential decoder 34 shown in FIG. 5.

In step 4, instead of storing the check node messages $n_i$-$n_{d_c}$ in a memory 100, the first part of the variable node computation is already performed according to $k_i=\Sigma n_j$ with $j=1 \ldots d_v, \neq i$ and the $k_i$ are stored in the memory 100. This calculation simplifies to $k_i=L_{LDPC}-n_i$ using the LDPC messages (which are denoted $L_{LDPC}$) which have been calculated for the turbo-iteration.

In step 6, the variable node calculation simplifies to $m_i=L_{SDD}+k_i$. The pre-calculated $k_i$ are taken from the memory 100 and the SDD messages $L_{SDD}$ are either received from the SDD 50 (during turbo mode) or taken from the memory 110 (during non-turbo mode).

The differential decoder 34 shown in FIGS. 2-5 may be implemented as digital logic gates in programmable or fixed form, such as in one or more Application Specific Integrated Circuits (ASICs) or digital signal processors.

As should be apparent from the foregoing description of FIGS. 4 and 5, LDPC degree distribution needs to support both turbo and non-turbo decoding iterations. Code optimization for turbo iterations would lead to a relatively high proportion of degree-2 variable nodes. Such an LDPC decoder would have very poor non-turbo performance. Conversely, code optimization for non-turbo iterations would lead to a degree distribution with poor turbo performance. A regular LDPC code with degree-3 variable nodes has acceptable turbo and non-turbo performance and would be suitable for use in the FEC decoder 52.

Figure 6:
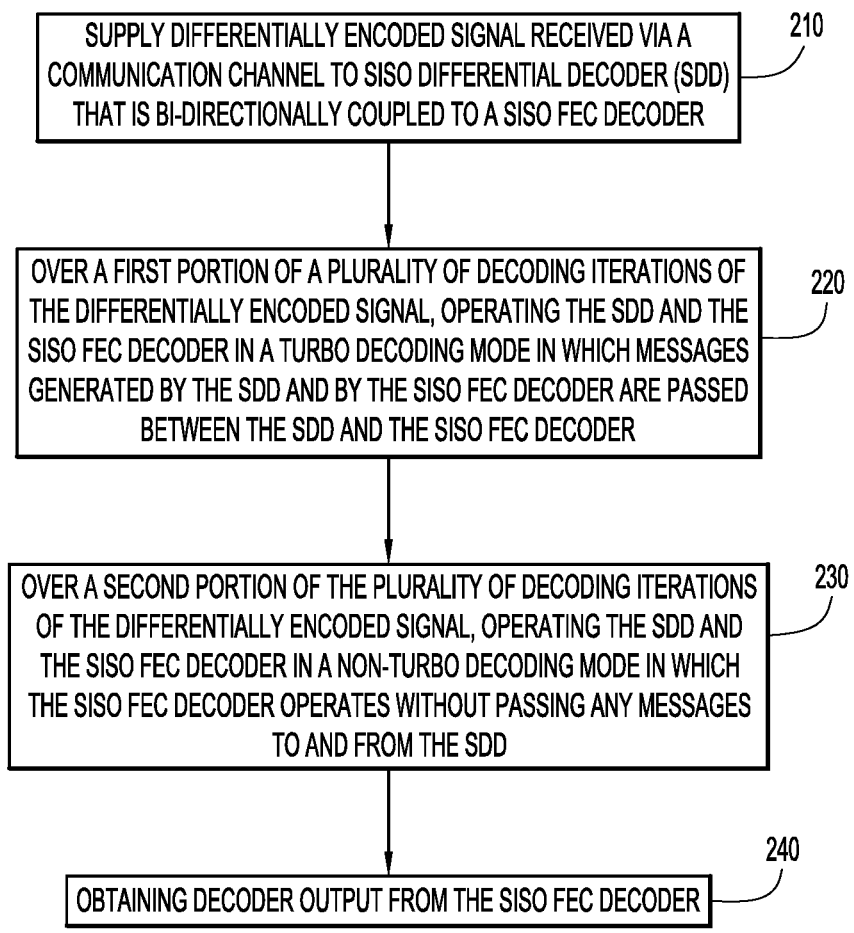
FIG. 6 is a high level flow chart depicting operation of the turbo/non-turbo differential decoder, according to an example embodiment.

Reference is now made to FIG. 6 which shows a flow chart 200 depicting, at a high level, the operation of the turbo/non-turbo decoder 34. At 210, a forward error corrected and differentially encoded signal received via a communication channel is obtained and supplied to a differential decoder, e.g., a SISO differential decoder (SDD) that is bi-directionally coupled to a FEC decoder, e.g., a SISO FEC decoder. At 220, over a first (and initial) portion of a plurality of decoding iterations for a given frame of the differential encoded signal, the SDD and the SISO FEC decoder are operated in a turbo decoding mode in which soft-decision messages generated by the SDD are passed to the SISO FEC decoder and FEC messages generated by the SISO FEC decoder are passed to the SDD. At 230, over a second (and final) portion of the plurality of decoding iterations for the given frame of the differential encoded signal, the SDD and the SISO FEC decoder are operated in a non-turbo decoding mode in which the SISO FEC decoder operates without passing any messages to and from the SDD. Thus, a switch is made between the turbo decoding mode for a number of decoding iterations and the non-turbo decoding mode for a number of iterations. At 240, decoder output is obtained at an output of the SISO FEC decoder.

The flow chart depicted in FIG. 6 is intended to be generic to the fixed/static scheduled switching between turbo and non-turbo decoding modes, as well as the dynamically adaptive switching between turbo and non-turbo decoding modes.

Turning now to FIGS. 7A and 7B, examples of fixed/static scheduled switching between turbo and non-turbo modes are shown. Each "T" denotes turbo decoding for a decoding iteration and each "NT" denotes non-turbo decoding for a decoding iteration. FIG. 7A shows an example in which turbo decoding is initially performed during a first portion of a frame 300 of an incoming differentially encoded signal, followed by non-turbo decoding for a second portion of the frame 300. In one example, the number of decoding iterations that use turbo decoding versus the number of iterations that use non-turbo decoding can be set by a network administrator according to conditions of the communication channel. If relatively few cycle slips are expected or observed, then over a predetermined number of iterations, only a few non-turbo iterations are performed. For example, over 15 iterations, the first 14 iterations may use turbo decoding and the last iteration uses non-turbo decoding. If more cycle slips are observed, then the number of non-turbo iterations may be higher. For example, over 15 iterations, the first 8 iterations may use turbo decoding, and then the last 7 iterations use non-turbo decoding.

The switch between turbo decoding and non-turbo decoding need not be a one time occurrence. For example, as shown in FIG. 7B, a schedule is shown in which turbo decoding is used for the first iteration, then the next two iterations use non-turbo decoding, followed by turbo decoding for one iteration, and then two iterations of non-turbo decoding, and so on. It is also possible that decoding modes are switched at each iteration such that the first iteration is turbo decoding, the second is non-turbo decoding, the third is turbo decoding, the fourth is non-turbo, e.g., (T-NT-T-NT-T-NT . . . ). A fixed/static schedule can be established to increase AWGN performance or trade-off AWGN performance and cycle slip tolerance. Different topologies of turbo and non-turbo iterations can dissolve short loops during messaging-passing decoding to reduce the error flow, such as may be the case with a schedule like the 14T-1NT example described above. It is also notable that using non-turbo decoding when SNR is sufficiently high has power saving benefits because it is possible to deactivate the SDD for longer periods of time.

Figure 8:
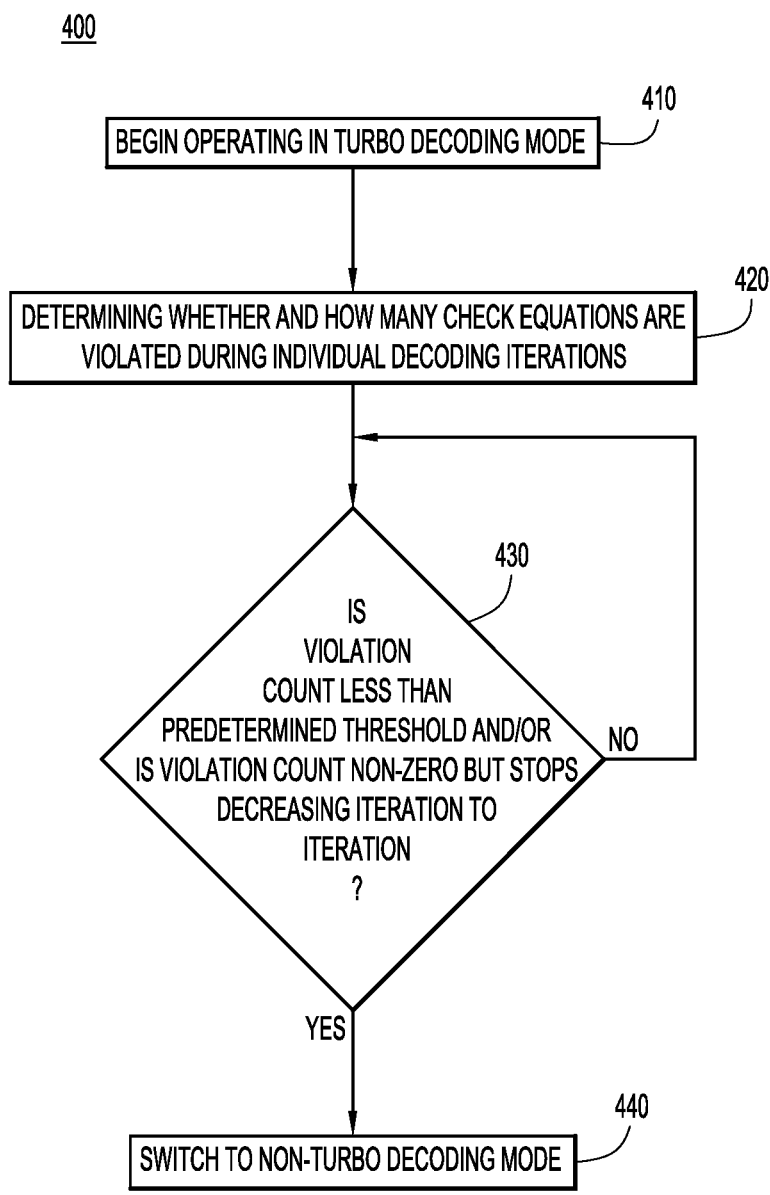
FIG. 8 is a flow chart depicting dynamically adaptive switching between the turbo decoding mode and the non-turbo decoding mode, according to an example embodiment.

Reference is now made to FIG. 8. FIG. 8 illustrates a flow chart 400 that depicts how a switching schedule between turbo and non-turbo decoding modes can be dynamically adapted on a frame-by-frame basis of the differentially encoded signal. Several of these operations may be performed by the control unit 120 shown in FIGS. 4 and 5. The dynamic adjustment is made by monitoring operation of the SISO FEC decoder, e.g., the LDPC decoder, at decoding iterations to determine whether to switch from the turbo decoding mode to the non-turbo decoding mode. At 410, decoding operation begins in the turbo decoding mode. At 420, using information obtained from the check node processor (or check nodes) concerning check equation violations, a determination is made as to whether and how many check equations are violated during individual decoding iterations. At 430, one and/or two control conditions may be evaluated. First, it is determined whether a count of check equation violations is less than a predetermined threshold. A check equation violation count that is less than a predetermined threshold indicates that the amount of residual bit errors in the current frame is well below the correction limit for LDPC decoding. Therefore, a switch to non-turbo decoding mode is made. In addition to, or instead of the first condition, it is determined whether the violation count is non-zero but stops decreasing iteration to iteration, and if so, a switch to non-turbo mode is made. Stagnating check equation violations indicates that there is no further decoding progress, and the slip-induced error floor has been reached.

Reference is now made to FIG. 9. FIG. 9 shows plots of simulation data generated for differentially encoded QPSK with a Cycle Slip Probability of $10^{-3}$ in terms of bit error ratio (BER) versus SNR. Plots are shown for simulations run for 12 decoding iterations for a frame of a differentially and inner FEC encoded signal. The plot shown at 500 was generated by running 12 iterations using turbo decoding and no iterations with non-turbo decoding, i.e., using a 12T/0NT schedule. Plot 510 was generated from running the first 9 iterations using turbo decoding and the remaining 3 iterations using non-turbo decoding, i.e., 9T/3NT. Plot 520 was generated from the first 6 iterations with turbo decoding and the last 6 iterations with non-turbo decoding, i.e., 6T/6NT. Plot 530 was generated from the first 3 iterations with turbo decoding and the last 9 with non-turbo decoding, i.e., 3T/9NT. In addition, in this example simulation, a threshold shown at 540 for using hard-decision (outer) FEC decoding is $10^{-6}$. This data shows that 12T/0NT+hard-decision (outer) FEC decoding fails at $10^{-3}$ cycle slip probability. Conversely, 9T/3NT is well below the hard-decision (outer) FEC threshold (negligible SNR-penalty).

As shown by arrow 550, the error floor decreases with increasing portion of non-turbo iterations. In fact, this data shows that more than 3 decades of improvement in BER is achieved for 3T/9NT. In addition, arrow 560 indicates that the SNR performance degrades with increasing portion of non-turbo iterations, e.g., approximately 0.5 dB for 3T/9NT.

In summary, in the presence of cycle slips, a turbo differential decoder frequently stabilizes in an erroneous state, with post-FEC errors. By switching to non-turbo decoding the erroneous state can be avoided. The post-FEC error floor, which is caused by cycle slips, is reduced significantly. At the same time, the good performance of turbo differential decoding for AWGN is maintained. With turbo/non-turbo switching, the decoder outperforms a pure FEC (LDPC) decoder and is more robust against cycle slips than a pure turbo differential decoder.

To summarize, in one form, a method is provided comprising: obtaining a forward error corrected and differentially encoded signal received via a communication channel; supplying the differentially encoded signal to a SISO differential decoder that is bi-directionally coupled to a SISO forward error correction decoder; over a first and initial portion of a plurality of decoding iterations for a given frame of the differentially encoded signal, operating the SISO differential decoder and the SISO forward error correction decoder in a turbo decoding mode in which soft-decision messages generated by the SISO differential decoder are passed to the SISO forward error correction decoder and forward error correction messages generated by the SISO forward error correction decoder are passed to the SISO differential decoder; over a second and final portion of the plurality of decoding iterations of the differentially encoded signal, operating the SISO differential decoder and the SISO forward error correction decoder in a non-turbo decoding mode in which the SISO forward error correction decoder operates without any messages passing to and from the SISO differential decoder; and obtaining decoder output from the SISO forward error correction decoder, wherein the first and initial portion of decoding iterations comprises a first predetermined number of decoding iterations for the given frame and the second and final portion of decoding iterations comprises a second predetermined number of decoding iterations for the given frame, and wherein operating in the non-turbo decoding mode for the second predetermined number of decoding iterations is performed after operating in the turbo decoding mode for the first predetermined number of decoding iterations.

In another form, an apparatus is provided comprising: a SISO differential decoder configured to receive as input a forward error corrected and differentially encoded signal received via a communication channel; and a SISO forward error correction decoder bi-directionally coupled to the SISO differential decoder, wherein the SISO forward error correction decoder is configured to generate a decoder output; wherein the SISO differential decoder and the SISO forward error correction decoder are configured to operate in a turbo decoding mode in which soft-decision messages generated by the SISO differential decoder are passed to the SISO forward error correction decoder and forward error correction messages generated by the SISO forward error correction decoder are passed to the SISO differential decoder for a first and initial portion of a plurality of decoding iterations for a given frame, and to operate in a non-turbo decoding mode in which the SISO forward error correction decoder operates without any messages passing to and from the SISO differential decoder for a second and final portion of the plurality of decoding iterations for the given frame, wherein the first and initial portion of decoding iterations comprises a first predetermined number of decoding iterations for the given frame and the second and final portion of decoding iterations comprises a second predetermined number of decoding iterations for the given frame, and wherein operating in the non-turbo decoding mode for the second predetermined number of decoding iterations is performed after operating in the turbo decoding mode for the first predetermined number of decoding iterations.

Still in another form, a non-transitory (tangible) processor readable storage media is provided that is encoded with instructions that, when executed by a processor, cause the processor to: obtain a forward error corrected and differentially encoded signal received via a communication channel; supply the differentially encoded signal to a soft-input soft-output (SISO) differential decoder that is bi-directionally coupled to a SISO forward error correction decoder; and over a first and initial portion of a plurality of decoding iterations for a given frame of the differentially encoded signal, operate the SISO differential decoder and the SISO forward error correction decoder in a turbo decoding mode in which soft-decision messages generated by the SISO differential decoder are passed to the SISO forward error correction decoder and forward error correction messages generated by the SISO forward error correction decoder are passed to the SISO differential decoder; over a second and final portion of the plurality of decoding iterations for the given frame of the differentially encoded signal, operate the SISO differential decoder and the SISO forward error correction decoder in a non-turbo decoding mode in which the SISO forward error correction decoder operates without any messages passing to and from the SISO differential decoder; and obtain decoder output from the SISO forward error correction decoder; wherein the first and initial portion of decoding iterations comprises a first predetermined number of decoding iterations for the given frame and the second and final portion of decoding iterations comprises a second predetermined number of decoding iterations for the given frame, and wherein operating in the non-turbo decoding mode for the second predetermined number of decoding iterations is performed after operating in the turbo decoding mode for the first predetermined number of decoding iterations.

The above description is intended by way of example only. Various modifications and structural changes may be made therein without departing from the scope of the concepts described herein and within the scope and range of equivalents of the claims.

What is claimed is:

1. A method comprising:
   obtaining a forward error corrected and differentially encoded signal received via a communication channel;
   supplying the differentially encoded signal to a soft-input soft-output (SISO) differential decoder that is bi-directionally coupled to a SISO forward error correction decoder;
   over a first and initial portion of a plurality of decoding iterations for a given frame of the differentially encoded signal, operating the SISO differential decoder and the SISO forward error correction decoder in a turbo decoding mode in which soft-decision messages generated by the SISO differential decoder are passed to the SISO forward error correction decoder and forward error correction messages generated by the SISO forward error correction decoder are passed to the SISO differential decoder;
   over a second and final portion of the plurality of decoding iterations for the given frame of the differentially encoded signal, operating the SISO differential decoder and the SISO forward error correction decoder in a non-turbo decoding mode in which the SISO forward error correction decoder operates without any messages passing to and from the SISO differential decoder;
   obtaining decoder output from the SISO forward error correction decoder; and
   switching between the turbo decoding mode and the non-turbo decoding mode based on a schedule that is dynamically adjusted on a frame-by-frame basis of the differentially encoded signal.

2. The method of claim 1, wherein the first and initial portion of decoding iterations comprises a first predetermined number of decoding iterations for the given frame and the second and final portion of decoding iterations comprises a second predetermined number of decoding iterations for the given frame, and wherein operating in the non-turbo decoding mode for the second predetermined number of decoding iterations is performed after operating in the turbo decoding mode for the first predetermined number of decoding iterations.

3. The method of claim 1, further comprising deactivating the SISO differential decoder during the second and final portion of decoding iterations in the non-turbo decoding mode.

4. The method of claim 1, wherein the SISO forward error correction decoder is a low density parity check decoder that includes a variable node processor, a check node processor, and a routing network that implements a parity check matrix coupling the variable node processor to the check node processor, and wherein operating in the turbo decoding mode comprises passing low density parity check messages generated by the variable node processor as feedback to the SISO differential decoder, and operating in the non-turbo decoding mode comprises operating the low density parity check decoder without passing low density parity check messages to the SISO differential decoder and without receiving updated soft-decision messages from the SISO differential decoder.

5. The method of claim 1, further comprising monitoring operation of the low density parity check decoder at decoding iterations to determine whether to switch from the turbo decoding mode to the non-turbo decoding mode.

6. The method of claim 5, wherein monitoring comprises monitoring operation of the check node processor to determine whether and how many check equations of the check node processor are violated during decoding iterations.

7. The method of claim 6, wherein switching comprises switching from the turbo decoding mode to the non-turbo decoding mode if one or both conditions occur:
   (a) a number of violated parity check equations is below a predetermined threshold; and
   (b) there is a non-zero number of violated parity check equations, and the number of violated parity check equations stops decreasing from one decoding iteration to the next.

8. The method of claim 4, further comprising: at a first decoding iteration:
   storing the differentially encoded signal in a memory of the SISO differential decoder, and forwarding the soft-decision messages to the low density parity check decoder;
   at each variable node in the variable node processor, receiving a corresponding soft-decision message and forwarding a plurality of duplicated messages equal in number to a variable node degree of the variable node processor, as variable node messages to corresponding check nodes of the check node processor via the parity check matrix;
   and each variable node storing the corresponding soft-decision message in a first memory of the low density parity check decoder.

9. The method of claim 8, further comprising, during subsequent decoding iterations:
   when in the turbo decoding mode:
      storing check node messages from the check nodes in a second memory of the low density parity check decoder;
      each variable node calculating a low density parity check message according to a summation of the check node messages, and supplying the low density parity check messages as feedback to the SISO differential decoder as a-priori input;
      the SISO differential decoder computing updated soft-decision messages based on the differential encoded signal stored in the memory of the SISO differential decoder and based on the a-priori input, and passing the updated soft-decision messages to the variable node processor;
      each variable node calculating variable node messages according to a summation of check node messages retrieved from the second memory and based on the updated soft-decision messages from the SISO differential decoder; and
      each check node in the check node processor receiving a plurality of variable node messages equal in number to a check node degree and evaluating a parity check equation according to a message passing algorithm to produce a plurality of check node messages that are returned to the variable nodes via the parity check matrix;
   when in the non-turbo mode:
      each variable node calculating variable node messages according to a summation of check node messages retrieved from the second memory and based on soft-decision messages from the SISO differential decoder stored in the first memory; and
      each check node in the check node processor receiving the plurality of variable node messages equal in number to the check node degree and evaluating a parity check equation according to the message passing algorithm to produce a plurality of check node messages that are returned to the variable nodes via the parity check matrix.

10. An apparatus comprising:
   a soft-input soft-output (SISO) differential decoder configured to receive as input a forward error corrected and differentially encoded signal received via a communication channel; and
   a SISO forward error correction decoder bi-directionally coupled to the SISO differential decoder, wherein the SISO forward error correction decoder is configured to generate a decoder output;
   wherein the SISO differential decoder and the SISO forward error correction decoder are configured to operate in a turbo decoding mode in which soft-decision messages generated by the SISO differential decoder are passed to the SISO forward error correction decoder and forward error correction messages generated by the SISO forward error correction decoder are passed to the SISO differential decoder for a first and initial portion of a plurality of decoding iterations for a given frame, and to operate in a non-turbo decoding mode in which the SISO forward error correction decoder operates without any messages passing to and from the SISO differential decoder for a second and final portion of a the plurality of decoding iterations for the given frame;
   a switch unit configured to couple messages between the SISO differential decoder and the low density parity check decoder in the turbo decoding mode and not coupling messages between the SISO differential decoder and the low density parity check decoder in the non-turbo decoding mode; and
   a control unit coupled to the switch unit, wherein the control unit is configured to control the switch unit to switch between the turbo decoding mode and non-turbo decoding mode based on a schedule that is dynamically adjusted on a frame-by-frame basis of the differentially encoded signal.

11. The apparatus of claim 10, wherein the first and initial portion of decoding iterations comprises a first predetermined number of decoding iterations for the given frame and the second and final portion of decoding iterations comprises a second predetermined number of decoding iterations for the given frame, and wherein the SISO differential decoder and the SISO forward error correction decoder are configured to operate in the non-turbo decoding mode for the second predetermined number of decoding iterations after operating in the turbo decoding mode for the first predetermined number of decoding iterations.

12. The apparatus of claim 11, wherein the SISO differential decoder is deactivated during the second and final portion of decoding iterations in the non-turbo decoding mode.

13. The apparatus of claim 11, wherein the SISO forward error correction decoder is a low density parity check decoder that includes a variable node processor, a check node processor, and a routing network that implements a parity check matrix coupling the variable node processor to the check node processor, and wherein in the turbo decoding mode, the variable node processor generates low density parity check messages that are passed as feedback to the SISO differential decoder and in the non-turbo decoding mode the low density parity check messages are not passed to the SISO differential decoder and the soft-decision messages are not received at the low density parity check decoder from the SISO differential decoder.

14. The apparatus of claim 11, wherein the control unit is configured to monitor operation of the low density parity check decoder at decoding iterations to determine whether to switch from the turbo decoding mode to the non-turbo decoding mode.

15. The apparatus of claim 14, wherein the control unit is configured to monitor by determining whether and how many check equations of the check node processor are violated during decoding iterations.

16. The apparatus of claim 15, wherein the control unit is configured to control switching from the turbo decoding mode to the non-turbo decoding mode if one or both conditions occur:
   (a) a number of violated parity check equations is below a predetermined threshold; and
   (b) there is a non-zero number of violated parity check equations, and the number of violated parity check equations stops decreasing from one decoding iteration to the next.

17. A non-transitory processor readable storage media encoded with instructions that, when executed by a processor, cause the processor to:
   obtain a forward error corrected and differentially encoded signal received via a communication channel;
   supply the differentially encoded signal to a soft-input soft-output (SISO) differential decoder that is bi-directionally coupled to a SISO forward error correction decoder; and
   over a first and initial portion of a plurality of decoding iterations for a given frame of the differentially encoded signal, operate the SISO differential decoder and the SISO forward error correction decoder in a turbo decoding mode in which soft-decision messages generated by the SISO differential decoder are passed to the SISO forward error correction decoder and forward error correction messages generated by the SISO forward error correction decoder are passed to the SISO differential decoder;
   over a second and final portion of the plurality of decoding iterations for the given frame of the differentially encoded signal, operate the SISO differential decoder and the SISO forward error correction decoder in a non-turbo decoding mode in which the SISO forward error correction decoder operates without any messages passing to and from the SISO differential decoder;
   obtain decoder output from the SISO forward error correction decoder; and
   switch between the turbo decoding mode and the non-turbo decoding mode based on a schedule that is dynamically adjusted on a frame-by-frame basis of the differentially encoded signal.

18. The processor readable storage media of claim 17, wherein the first and initial portion of decoding iterations comprises a first predetermined number of decoding iterations for the given frame and the second and final portion of decoding iterations comprises a second predetermined number of decoding iterations for the given frame, and wherein the instructions cause the processor to operate in the non-turbo decoding mode for the second predetermined number of decoding iterations after operating in the turbo decoding mode for the first predetermined number of decoding iterations.

19. The processor readable storage media of claim 17, further comprising instructions that cause the processor to deactivate the SISO differential decoder during the second and final portion of decoding iterations in the non-turbo decoding mode.

20. The processor readable storage media of claim 16, further comprising instructions that cause the processor to monitor operation of the low density parity check decoder at decoding iterations to determine whether to switch from the turbo decoding mode to the non-turbo decoding mode.

* * * * *